United States Patent
Choi et al.

(10) Patent No.: US 11,380,878 B2
(45) Date of Patent: Jul. 5, 2022

(54) METHOD FOR MANUFACTURING FOLDABLE DISPLAY DEVICE BY SELECTIVELY HARDENING RESIN USING LIGHT IRRADIATION PROCESS

(71) Applicant: SAMSUNG DISPLAY CO., LTD., Yongin-si (KR)

(72) Inventors: Wonwoo Choi, Hwaseong-si (KR); Woo Yong Sung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/866,825

(22) Filed: May 5, 2020

(65) Prior Publication Data
US 2021/0043858 A1    Feb. 11, 2021

(30) Foreign Application Priority Data
Aug. 7, 2019  (KR) .................... 10-2019-0095928

(51) Int. Cl.
| H01L 51/56 | (2006.01) |
| B41M 5/00 | (2006.01) |
| H01L 51/00 | (2006.01) |
| H01L 51/52 | (2006.01) |
| H01L 27/32 | (2006.01) |

(52) U.S. Cl.
CPC .......... *H01L 51/56* (2013.01); *B41M 5/0047* (2013.01); *H01L 27/3244* (2013.01); *H01L 51/0097* (2013.01); *H01L 51/5253* (2013.01); *H01L 2251/5338* (2013.01)

(58) Field of Classification Search
CPC ............................. H01L 51/56; B41M 5/0047
See application file for complete search history.

(56) References Cited

U.S. PATENT DOCUMENTS

| 9,069,521 | B2 | 6/2015 | Lee et al. |
| 9,812,659 | B2 | 11/2017 | Kwon et al. |
| 2018/0162095 | A1* | 6/2018 | Lim .................. B32B 3/08 |
| 2018/0337224 | A1* | 11/2018 | Aoki .............. G09G 3/3233 |
| 2019/0177459 | A1* | 6/2019 | Kim .................. C08L 33/14 |

FOREIGN PATENT DOCUMENTS

| KR | 1020140033546 A | 3/2014 |
| KR | 1020180068382 A | 6/2018 |

\* cited by examiner

*Primary Examiner* — Michael Jung
(74) *Attorney, Agent, or Firm* — Cantor Colburn LLP

(57) ABSTRACT

A method for manufacturing the display device includes preparing a display panel on which a folding area folded with reference to a virtual folding axis and first and second non-folding areas, which are adjacent to both sides of the folding area, are defined and which displays an image, providing a resin on a first surface of the display panel, primarily hardening the resin, and secondarily hardening first and second resin areas of the resin, which respectively correspond to the first non-folding area and the second non-folding area of the display panel.

14 Claims, 17 Drawing Sheets

METHOD FOR MANUFACTURING FOLDABLE DISPLAY DEVICE BY SELECTIVELY HARDENING RESIN USING LIGHT IRRADIATION PROCESS

This application claims priority to Korean Patent Application No. 10-2019-0095928, filed on Aug. 7, 2019, and all the benefits accruing therefrom under 35 U.S.C. § 119, the content of which in its entirety is herein incorporated by reference.

BACKGROUND

1. Field

Exemplary embodiments of the invention herein relate to a display device and a method for manufacturing the same, and more particularly, to a foldable display device and a method for manufacturing the same.

2. Description of the Related Art

Electronic devices such as televisions, mobile phones, tablet computers, navigators, game consoles, and the like are provided with display devices for providing information.

In recent years, various types of display devices have been developed with a development of technology of the display devices. Flexible display devices that are foldable (or bendable) or rollable, for example, are being developed. The flexible display devices that are variously modified in shape may be easily carried and improve users' convenience.

SUMMARY

Exemplary embodiments of the invention provide a foldable display device having improved reliability and a method for manufacturing the same.

An exemplary embodiment of the invention provides a method for manufacturing a display device, the method including preparing a display panel on which a folding area folded with reference to a virtual folding axis and first and second non-folding areas, which are adjacent to both sides of the folding area, are defined and which displays an image, providing a resin on a first surface of the display panel, primarily hardening the resin, and secondarily hardening a first resin area of the resin, which corresponds to the first non-folding area of the display panel, and a second resin area of the resin, which corresponds to the second non-folding area of the display panel.

In an exemplary embodiment, the providing the resin on the first surface of the display panel may be performed by an inkjet printing unit.

In an exemplary embodiment, the primarily hardening the resin may include a first light irradiation process.

In an exemplary embodiment, the first light irradiation process may be performed by ultraviolet ("UV") light.

In an exemplary embodiment, the first light irradiation process may be performed on a top surface of the resin along a first movement path.

In an exemplary embodiment, the secondarily hardening the first resin area and the second resin area may include a second light irradiation process and a third light irradiation process, where the second light irradiation process may be performed on a top surface of the first resin area along a second movement path, and the third light irradiation process may be performed on a top surface of the second resin area along a third movement path.

In an exemplary embodiment, each of the second light irradiation process and the third light irradiation process may be performed by UV light.

In an exemplary embodiment, each of energy of second light used in the second light irradiation process and energy of third light used in the third light irradiation process may be greater than that of first light used in the first light irradiation process.

In an exemplary embodiment, the energy of the second light used in the second light irradiation process and the energy of the third light used in the third light irradiation process may be the same as each other.

In an exemplary embodiment, the secondarily hardening the first resin area and the second resin area may include preparing a mask above a third resin area corresponding to the folding area of the display panel, and secondarily hardening the first resin area and the second resin area.

In an exemplary embodiment, after the primarily hardening the resin, a third protection layer area corresponding to the folding area of the display panel is formed, after the secondarily hardening the first resin area, a first protection layer area is formed, after the secondarily hardening the second resin area, a second protection layer area is formed, and each of the first protection layer area and the second protection layer area has a modulus greater than that of the third protection layer area.

In an exemplary embodiment, the primarily hardening the resin may include preparing a mask above each of the first resin area and the second resin area, and primarily hardening a third resin area of the resin corresponding to the folding area of the display panel.

In an exemplary embodiment, the primarily hardening the third resin area may include a first light irradiation process, the secondary hardening of the first resin area and the second resin area may include a second light irradiation process and a third light irradiation process, and each of the first light irradiation process, the second light irradiation process, and the third light irradiation process may be performed by UV light.

In an exemplary embodiment, each of energy of second light used in the second light irradiation process and energy of third light used in the third light irradiation process may be greater than that of first light used in the first light irradiation process.

In an exemplary embodiment of the invention, a method for manufacturing a display device includes preparing a display panel on which a folding area folded with reference to a virtual folding axis and first and second non-folding areas, which are adjacent to both sides of the folding area, are defined on a plane and which displays an image, providing a first resin on a first resin area corresponding to the first non-folding area of a first surface of the display panel and providing a second resin on a second resin area corresponding to the second non-folding area of the first surface of the display panel, primarily hardening the first resin and the second resin, providing a third resin on a third resin area corresponding to the folding area of the first surface of the display panel, and secondarily hardening the third resin.

In an exemplary embodiment, each of the first resin and the second resin may include a material having a modulus different from that of the third resin.

In an exemplary embodiment, the primarily hardening the first resin and the second resin may include a first light irradiation process, the hardening the third resin may include a second light irradiation process, and each of the first light irradiation process and the second light irradiation process may be performed by UV light.

In an exemplary embodiment of the invention, a display device includes a display panel on which a folding area folded with reference to a virtual folding axis and first and second non-folding areas, which are adjacent to both sides of the folding area, are defined and which displays an image, and a protection layer disposed on a first surface of the display panel. The protection layer includes a first protection layer area, a second protection layer area, and a third protection layer area respectively corresponding to the first non-folding area, the second non-folding area and the folding area, the third protection layer area is provided by performing hardening one time, the first protection layer area and the second protection layer area are provided by performing hardening two times, and each of the first protection layer area and the second protection layer area has a modulus greater than that of the third protection layer area.

In an exemplary embodiment, the protection layer may further include a material that is capable of being applied by an inkjet printing unit.

In an exemplary embodiment, the protection layer may include a material that is capable of being hardened by UV light.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
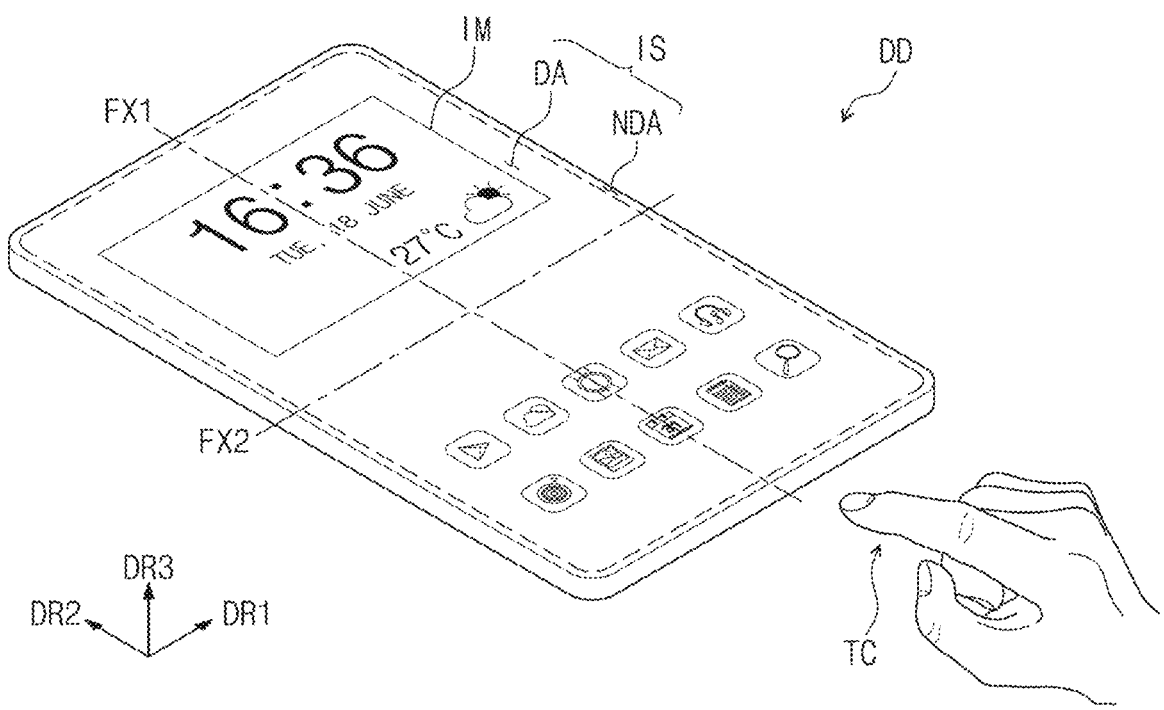
FIG. 1 is a perspective view of an exemplary embodiment of a display device according to the invention.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another exemplary embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described with reference to the accompanying drawings.

FIG. 1 is a perspective view of an exemplary embodiment of a display device according to the invention.

Referring to FIG. 1, an exemplary embodiment of a display device DD according to the invention has a rectangular shape with a short side in a first direction DR1 and a long side in a second direction DR2 crossing the first direction DR1. However, the display device DD is not limited in shape. In an exemplary embodiment, the display device DD may have various shapes, for example.

The display device DD may be a folding-type (foldable) electronic device. An exemplary embodiment of the display device DD according to the invention may be folded with respect to folding axes FX1 and FX2 extending in a predetermined direction. Hereinafter, the folded state with respect to the folding axes FX1 and FX2 may be defined as a folded state, and the unfolded state is defined as a non-folded state.

The folding axes FX1 and FX2 may extend in the first direction DR1 or the second direction DR2. In an exemplary embodiment of the invention, the folding axis extending in the second direction DR2 is defined as a first folding axis FX1, and a folding axis extending in the first direction DR1 is defined as a second folding axis FX2. The display device DD may include only one folding axis of the first folding axis FX1 and the second folding axis FX2. That is, the display device DD may be folded with respect to one folding axis of the first folding axis FX1 and the second folding axis FX2.

The display device DD according to the invention may be used for large-sized display devices such as televisions, monitors, and the like and small and middle-sized display devices such as mobile phones, tablet personal computer ("PC"), navigation units for vehicles, game consoles, and the like. The above-described equipment are exemplified as merely an exemplary embodiment, and thus, the display device DD may be adopted for other electronic equipment unless departing from the spirit and scope of the invention.

As illustrated in FIG. 1, the display device DD may display an image IM in a third direction DR3 on a display surface IS that is parallel to each of the first and second directions DR1 and DR2. The display surface IS on which the image IM is displayed may correspond to a front surface of the electronic device DD.

The display surface IS of the display device DD may be divided into a plurality of areas. A display area DA and a non-display area NDA may be defined on the display surface IS of the display device DD.

The display area DA may be an area on which an image IM is displayed, and a user may see the image IM through the display area DA. In an exemplary embodiment, the display area DA may have a rectangular shape, for example. The non-display area NDA may surround the display area DA. Thus, the shape of the display area DA may be substantially defined by the non-display area NDA. However, the exemplary embodiment of the invention is merely an example. In an exemplary embodiment, the non-display area NDA may be disposed adjacent to only one side of the display area DA or may be omitted, for example. An exemplary embodiment of the display device DD according to the invention may be implemented in various exemplary embodiments, but is not limited to a specific embodiment.

The non-display area NDA is an area which is adjacent to the display area DA and on which the image IM is not displayed. A bezel area of the display device DD may be defined by the non-display area NDA.

The non-display area NDA may surround the display area DA. However, the exemplary embodiment of the invention is merely an example. In an exemplary embodiment, the non-display area NDA may be disposed adjacent to only a portion of an edge of the display area DA, but is not limited to a specific embodiment, for example.

The display device DD according to the invention may sense a user's input TC applied from the outside. In an exemplary embodiment, the user's input TC includes various types of external inputs such as a portion of user's body, light, heat, a pressure, or the like. In this exemplary embodiment, the user's input TC is illustrated as a user's hand applied to the front surface. However, this is merely an example. As described above, the user's input TC may be provided in various forms (for example, input using a user's hand, input using a mechanism such as a touch pen or a stylus pen, and the like). Also, the display device DD may sense the user's input TC applied to a side surface or a rear surface of the display device DD according to the structure of the display device DD, but is not limited to a specific embodiment.

The display device DD may activate the display surface IS to display the image IM and also sense an external input TC. In this exemplary embodiment, an area on which the external input TC is sensed may be provided on the display area DA on which the image IM is displayed. However, this is merely an example. In an exemplary embodiment, the area on which the external input TC may be provided on the non-display area NDA or provided on an entire area of the display surface IS, for example.

Figure 2A:
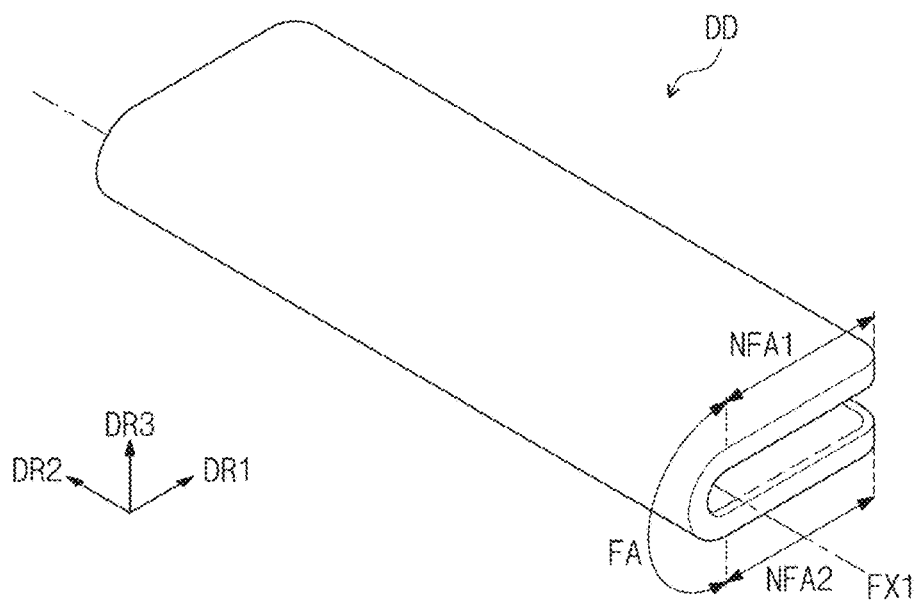
FIG. 2A is a view illustrating a state in which the display device of FIG. 1 is in-folded along a first folding axis.
Figure 2B:
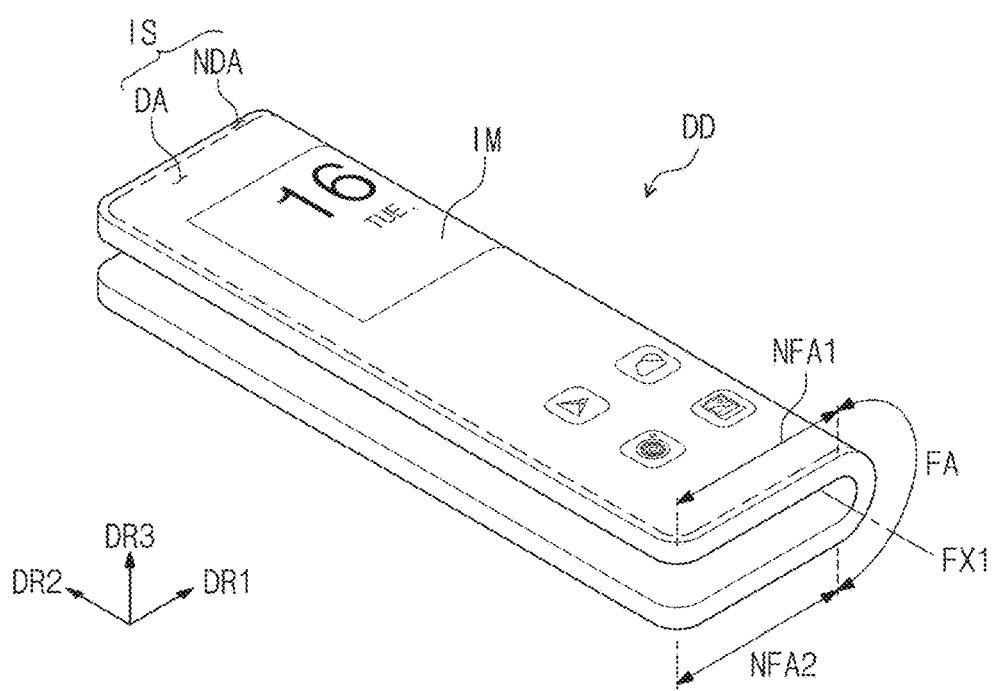
FIG. 2B is a view illustrating a state in which the display device of FIG. 1 is out-folded along the first folding axis.

FIG. 2A is a view illustrating a state in which the display device of FIG. 1 is in-folded along the first folding axis FX1, and FIG. 2B is a view illustrating a state in which the display device of FIG. 1 is out-folded along the first folding axis FX1.

Referring to FIG. 2A, the display device DD may be in-folded with respect to the first folding axis FX1.

A plurality of areas may be defined on the display device DD according to an operation type. The plurality of areas may be divided into a folding area FA and at least one non-folding area NFA1 or NFA2. The folding area FA is defined between the two non-folding areas NFA1 and NFA2.

In an exemplary embodiment, the non-folding areas NFA1 and NFA2 may include a first non-folding area NFA1 and a second non-folding area NFA2. The first non-folding area NFA1 may be adjacent to one side of the folding area FA in the first direction DR1, and the second non-folding area NFA2 may be adjacent to the other side of the folding area FA in the first direction DR1.

The display device DD may be in-folded or out-folded. Here, the in-folding refers to folding of the display surface IS to face each other, and the out-folding refers to folding of the rear surface of the display device DD to face each other.

The folding area FA is an area that is folded with respect to the first folding axis FX1. When the display device DD is folded with respect to the first folding axis FX1, the folding area FA may have an area having a substantially predetermined curvature. Here, the first folding axis FX1 may extend in the second direction DR2, that is, in a direction parallel to the long side of the display device DD (long side direction).

The display device DD illustrated in FIG. 2A may be in-folded so that the display surface IS of the first non-folding area NFA1 and the display surface IS of the second non-folding area NFA2 face each other.

Referring to FIG. 2B, the display device DD may be out-folded with respect to the first folding axis FX1. When the display device DD is out-folded, the display surface IS may be exposed to the outside.

In an exemplary embodiment, the display device DD may be in-folded and out-folded. However, in the following description, the display device DD of the invention may be described as being in-folded or out-folded.

Figure 3A:
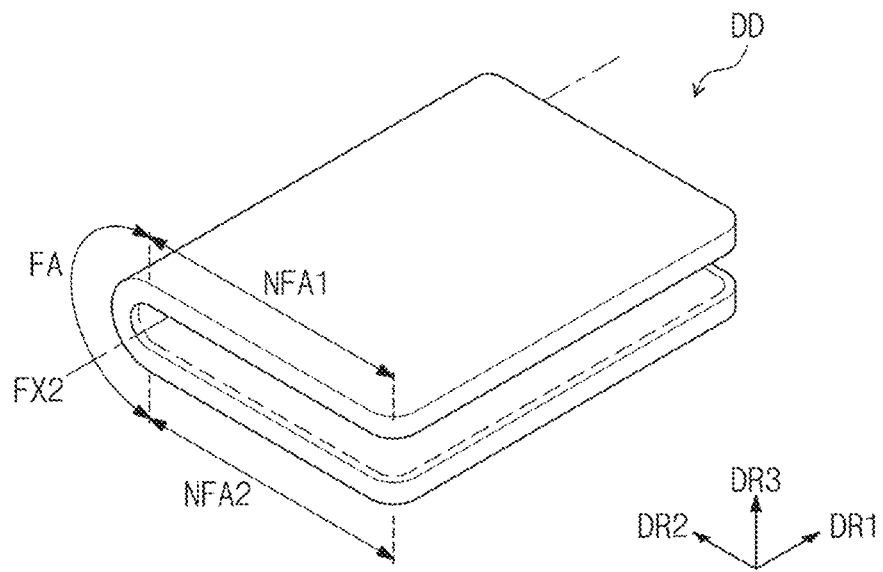
FIG. 3A is a view illustrating a state in which the display device of FIG. 1 is in-folded along a second folding axis.
Figure 3B:
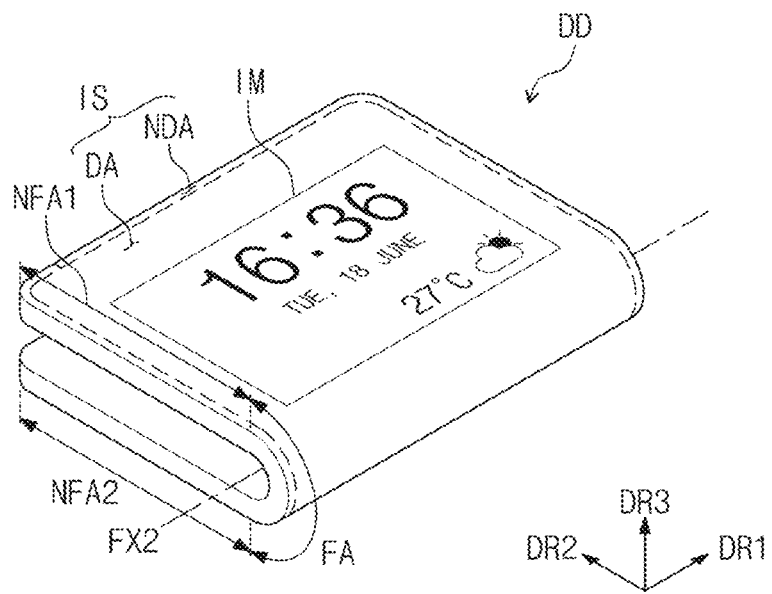
FIG. 3B is a view illustrating a state in which the display device of FIG. 1 is out-folded along the second folding axis.

FIG. 3A is a view illustrating a state in which the display device of FIG. 1 is in-folded along a second folding axis FX2, and FIG. 3B is a view illustrating a state in which the display device of FIG. 1 is out-folded along the second folding axis FX2.

Referring to FIGS. 3A and 3B, the display device DD may be in-folded or out-folded with respect to the second folding axis FX2. The second folding axis FX2 may extend in the first direction DR1, i.e., extend in a direction parallel to the short side of the display device DD (short side direction).

In this exemplary embodiment, although one folding area FA is defined on the display device DD, the invention is not limited thereto. In another exemplary embodiment of the invention, a plurality of folding areas may be defined on the display device DD.

Figure 4A:
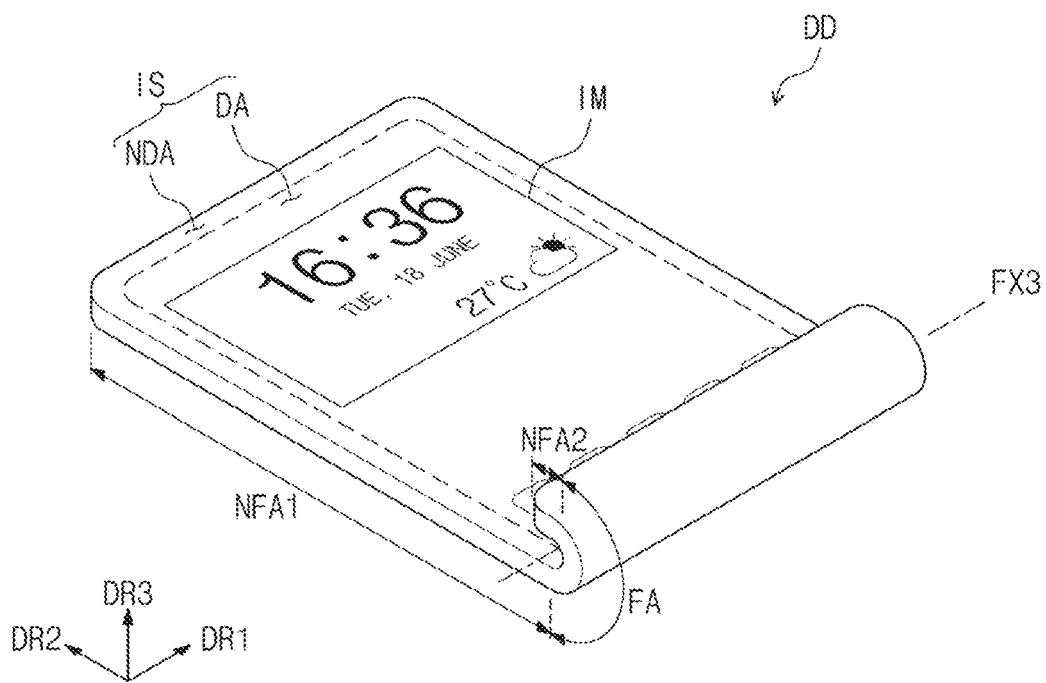
FIG. 4A is a view illustrating a state in which the display device of FIG. 1 is in-folded along a third folding axis.
Figure 4B:
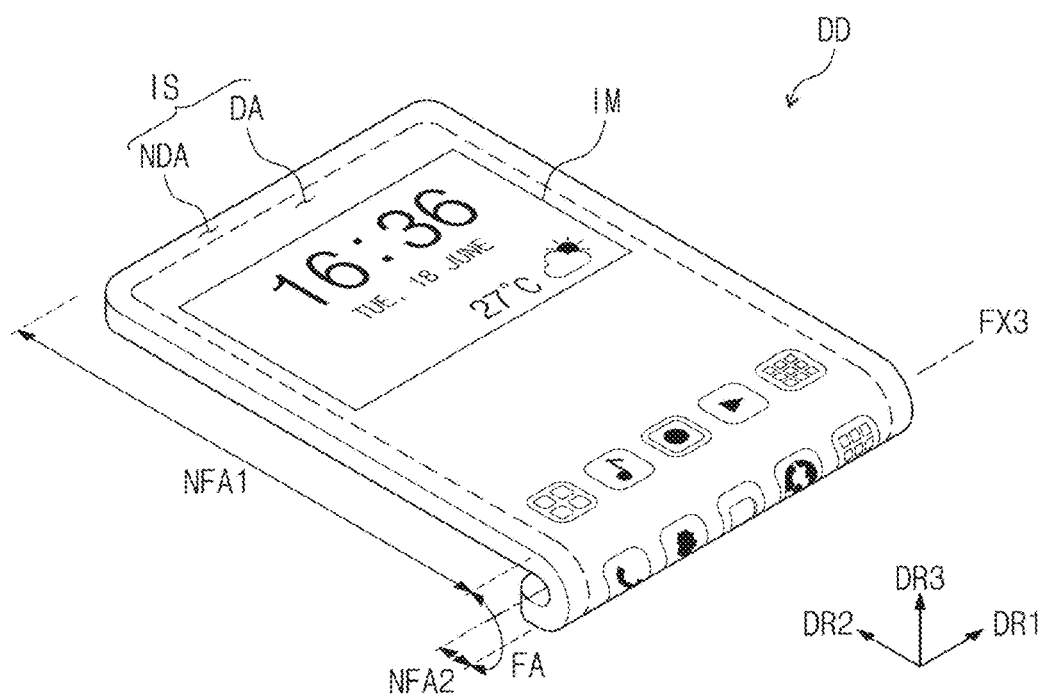
FIG. 4B is a view illustrating a state in which the display device of FIG. 1 is out-folded along the third folding axis.

FIG. 4A is a view illustrating a state in which the display device of FIG. 1 is in-folded along a third folding axis FX3, and FIG. 4B is a view illustrating a state in which the display device of FIG. 1 is out-folded along the third folding axis FX3.

Referring to FIGS. 4A and 4B, the display device DD may be in-folded or out-folded with respect to the second folding axis FX3. The third folding axis FX3 may extend in the first direction DR1. i.e., extend in a direction parallel to the short side of the display device DD. FIGS. 3A and 3B, the second folding axis FX2 of the display device DD may be disposed at a central portion of the display device DD. In contrast, in FIGS. 4A and 4B, the third folding axis FX3 of the display device DD may be disposed close to one end of the display device DD.

Figure 4C:
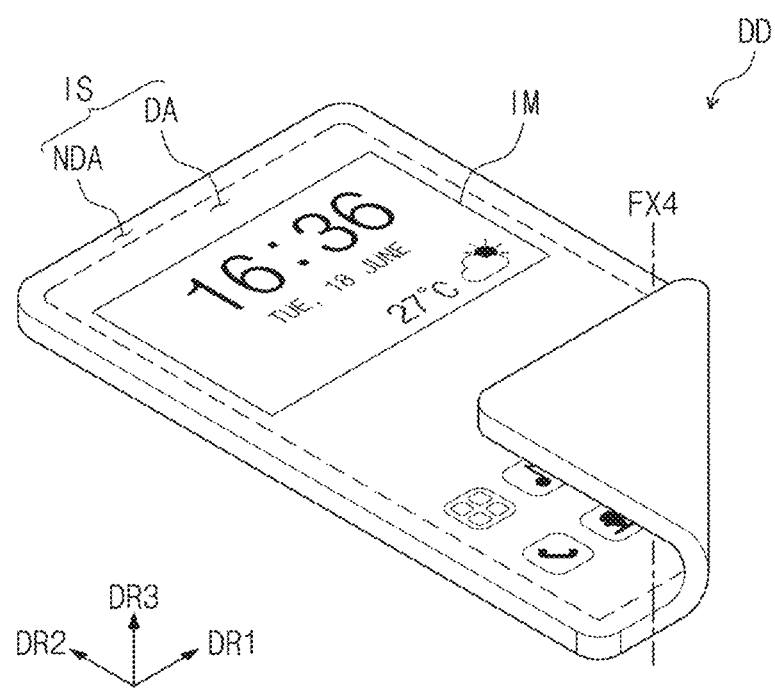
FIG. 4C is a view illustrating a state in which the display device of FIG. 1 is in-folded along a fourth folding axis.

FIG. 4C is a view illustrating a state in which the display device of FIG. 1 is in-folded along a fourth folding axis.

Referring to FIG. 4C, the display device DD may be folded in a diagonal direction. Although the folding method of the display device is exemplarily illustrated in FIGS. 2A to 4C, the invention is not limited thereto.

Figure 5:
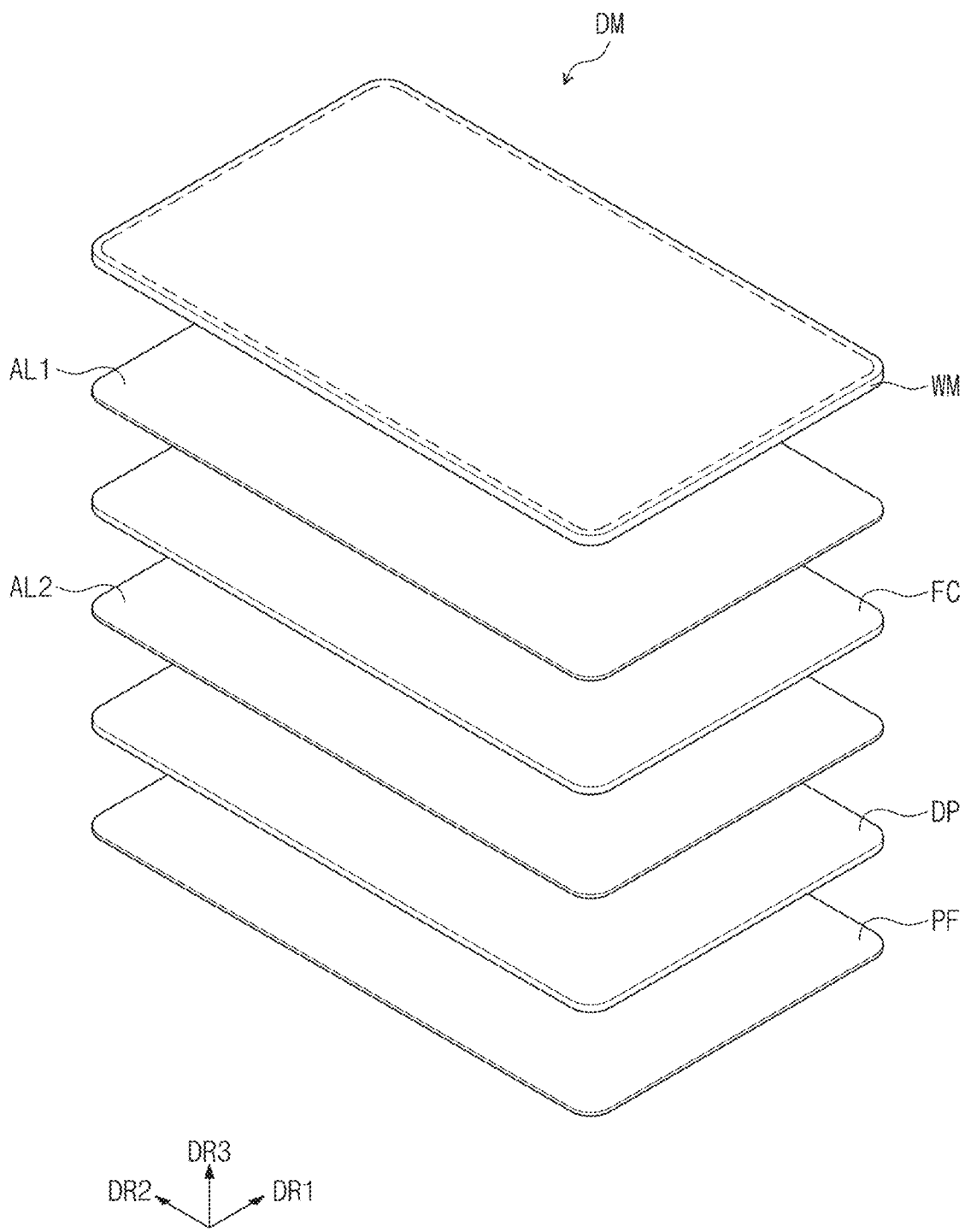
FIG. 5 is a perspective view of an exemplary embodiment of a display device DD according to the invention.
Figure 6:
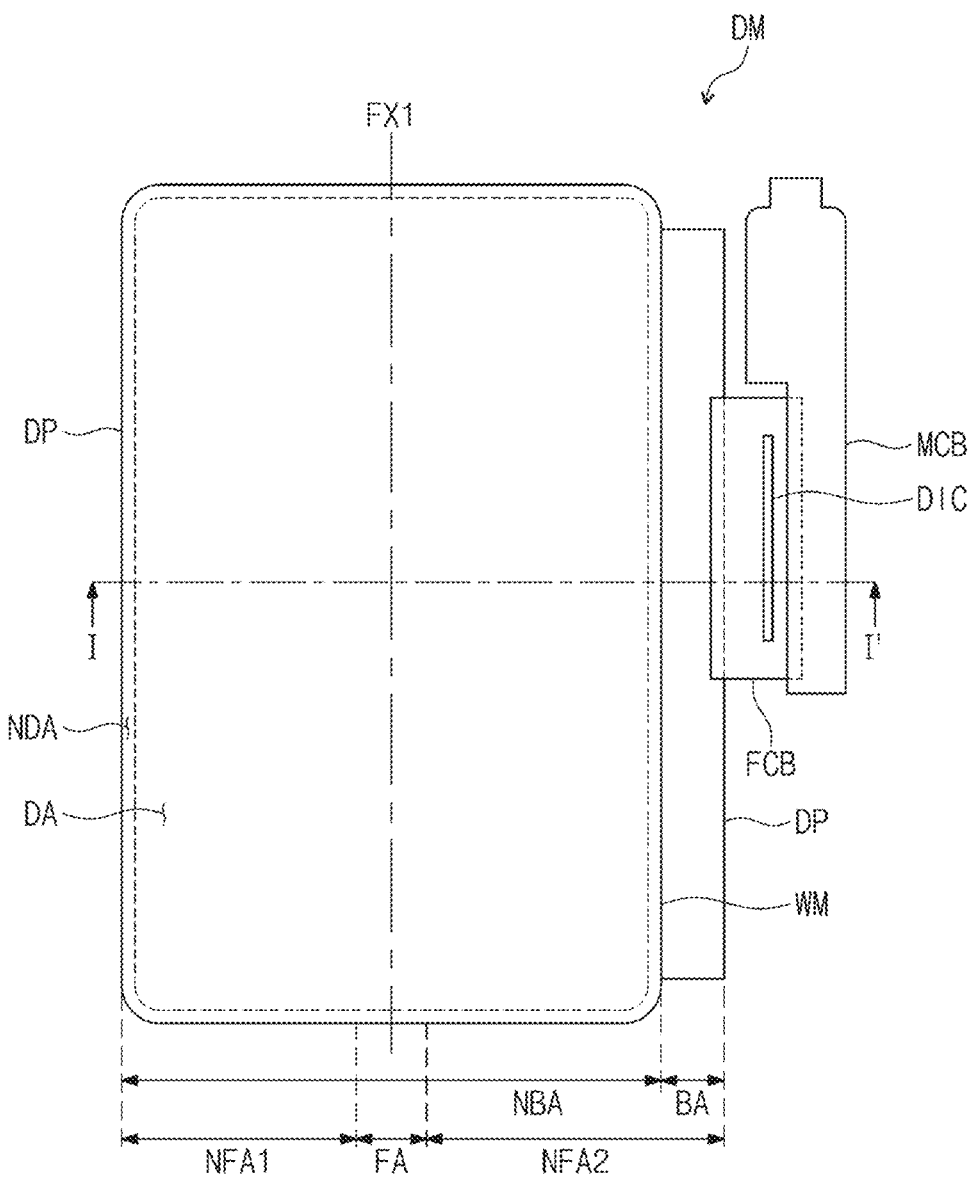
FIG. 6 is a plan view of the display device of FIG. 5.

FIG. 5 is a perspective view of an exemplary embodiment of a display module DM according to the invention, and FIG. 6 is a plan view of the display module DM of FIG. 5.

Referring to FIGS. 5 and 6, an exemplary embodiment of the display module DM according to the invention may include a display panel DP displaying an image and a window module WM disposed on the display panel DP. The display module DM constitutes a portion of the display device DD (refer to FIG. 1), and in particular, the display module DM may provide the display surface IS (refer to FIG. 1) of the display device DD.

The display panel DP may be a flexible display panel. Thus, the display panel DP may be folded or unfolded with respect to the first folding axis FX1. In an exemplary embodiment, the display panel 110 may be an organic light emitting display panel.

The display panel DP may be divided into the folding area FA, a first non-folding area NFA1, and the second non-folding area NFA2. The display panel DP may be divided into a non-bending area NBA and a bending area BA. A portion of the folding area FA, the first non-folding area NFA1, and the second non-folding area NFA2 of the display panel DP may be disposed on the non-bending area NBA, and the other portion of the second non-folding area NFA2 may be disposed on the bending area BA. The bending area BA will be described later in detail.

A top surface of the window module WM defines the display surface IS of the display device DD illustrated in FIG. 1. The window WM may be optically transparent. Thus, an image generated in the display panel DP may pass through the window module WM and be easily recognized by the user.

The window module WM may include a flexible material. Thus, the window module WM may be folded or unfolded with respect to the first folding axis FX1. That is, the window module WM may be deformed in shape together with deformation in shape of the display panel DP.

The window module WM may transmit the image transmitted from the display panel DP and also mitigate an external impact to prevent the display panel DP from being damaged or malfunctioned by the external impact. The external impact may mean force applied from the outside, which is expressed as a pressure, stress, or the like, i.e., force that causes defects of the display panel DP. The window module WM may prevent defects of the display panel DP by alleviating bending deformation, compression deformation, and/or tensile deformation of the display panel DP due to a point impact and a surface impact.

One or more functional layers FC may be disposed between the display panel DP and the window module WM. In an exemplary embodiment, the functional layers FC may include an anti-reflection layer that blocks reflection of external light. The anti-reflection layer may prevent elements constituting the display panel DP from being visible by the external light incident through the front surface of the display device DD. The anti-reflection layer may include a polarizing film and/or a phase retardation film. The number of phase retardation films and a phase retardation length of the phase retardation film may be determined according to an operating principle of the anti-reflection layer.

The functional layer FC may further include an input sensing layer sensing the user's input TC (refer to FIG. 1). The input sensing layer may be provided as a separate layer with respect to the display panel DP and may be coupled through an adhesion layer. In another exemplary embodiment, the input sensing unit may be integrated with the display panel DP through at least one continuous process. That is, the input sensing unit may be directly disposed on an encapsulation layer (not shown) of the display panel DP. Here, the direct disposition may represent that the input sensing circuit is disposed on the display panel DP without using a separate adhesion member. In an exemplary embodiment, the input sensing unit is disposed on the top surface of the display panel DP, but is not limited thereto. In another exemplary embodiment, the input sensing layer may be disposed on a bottom surface of the display panel.

The window module WM and the functional layer FC may adhere to each other through a first adhesion layer AL1. The display panel DP and the functional layer FC may adhere to each other through a second adhesion layer AL2.

The first adhesion layer AL1 and the second adhesion layer AL2 may be optically transparent, respectively. Each of the first adhesion layer AL1 and the second adhesion layer AL2 may be an adhesion layer prepared by applying and curing a liquid adhesion material or may be an adhesion sheet prepared separately. In an exemplary embodiment, each of the first adhesion layer AL1 and the second adhesion layer AL2 may be a pressure sensitive adhesive ("PSA"), an optical clear adhesive ("OCA"), or an optical clear resin ("OCR"), for example.

A protection layer PF may be disposed on a rear surface of the display panel DP. The protection layer PF may be a layer for absorbing an impact applied from the outside to protect the display panel DP from the impact. The protection layer PF may be directly disposed on the rear surface of the display panel DP without a separate adhesion layer or adhesion material. The protection layer PF may include a photocurable material. Here, the protection layer PF may include a material having sufficient flexibility to facilitate the folding when the display module DM is folded with respect to the first folding axis FX1. The protection layer PF will be described later in detail.

The display module DM may further include a flexible circuit board FCB connected to the display panel DP and a driving chip DIC disposed (e.g., mounted) on the flexible circuit board FCB. The flexible circuit board FCB may be connected to a main circuit board MCB. Components such as a control chip, a plurality of passive elements, and a plurality of active elements may be disposed (e.g., mounted) on the main circuit board MCB. The main circuit board MCB may be provided as a flexible film like the flexible circuit board FCB.

In this exemplary embodiment, the display module DM has a chip on film ("COF") structure in which the driving chip DIC is disposed (e.g., mounted) on the flexible circuit board FCB. However, the invention is not limited thereto. In an exemplary embodiment, the display module DM may have a chip on panel ("COP") or chip on glass ("COG") structure in which the driving chip DIC is disposed (e.g., mounted) on the display panel DP, for example.

Figure 7:
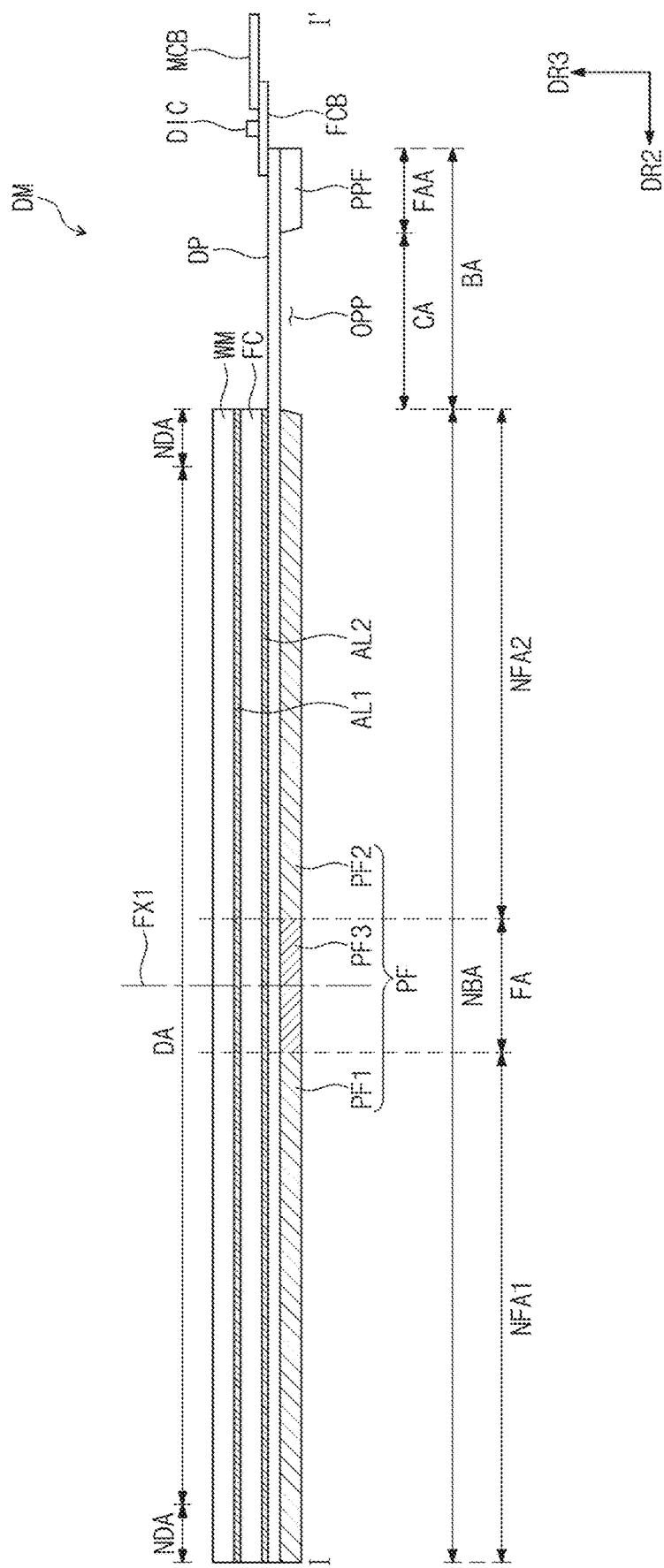
FIG. 7 is a cross-sectional view taken along line I-I' of FIG. 6.

FIG. 7 is a cross-sectional view taken along line I-I' of FIG. 6.

Referring to FIG. 7, the display module DM may include a flexible display panel DP. In FIG. 7, the display panel DP is briefly illustrated as a single layer. Although not illustrated in the drawings, the display panel DP may include a base layer, a circuit layer, a light emitting element layer, and an encapsulation layer.

The display panel DP may be divided into a bending area BA and a non-bending area NBA. The non-bending area NBA may be an area including the display area DA and the non-display area NDA of the display module DM. Also, the non-bending area NDA may include the folding area FA, the first non-folding area NFA1, and the second non-folding area NFA2 of the display panel DP. The bending area BA of the display panel DP may be bent toward the rear surface of the display panel DP at a predetermined curvature.

The protection layer PF includes a first protection layer area PF1 corresponding to the first non-folding area NFA1, a second protection layer area PF2 corresponding to the second non-folding area NFA2, and a third protection layer area PF3 corresponding to the folding area FA on the display panel DP.

Each of the first protection layer area PF1 and the second protection layer area PF2, which correspond to the first non-folding area NFA1 and the second non-folding area NFA2 of the display panel DP, may have a relatively high modulus to improve durability of the display panel DP. The third protection layer area PF3 corresponding to the folding area FA of the display panel DP may have a low modulus to improve flexibility. Also, the protection layer PF may be disposed on a first surface (bottom surface) of the display panel DP without a separate adhesion layer or adhesion material.

The bending area BA includes a curvature area CA and an opposite area FAA. The curvature area CA is an area that is adjacent to the non-bending area NBA and substantially bent. The opposite area FAA is adjacent to the curvature area CA and faces the non-bending area NBA in a bent state. The flexible circuit board FCB is connected to the opposite area FAA of the display panel DP.

The protection layer PF is disposed to correspond to the non-bending area NBA. The protection film PPF is disposed to correspond to the opposite area FAA. A bending opening part OPP on which the protection layer PF and the protection film PPF are not disposed may be defined in the curvature area CA. Since the protection layer PF and the protection film PPF are not disposed on the curvature area CA, stress occurring in the curvature area CA during the bending may be reduced.

FIGS. 8A to 8E are cross-sectional views illustrating an exemplary embodiment of a process of manufacturing a display device according to the invention.

Figure 8A:
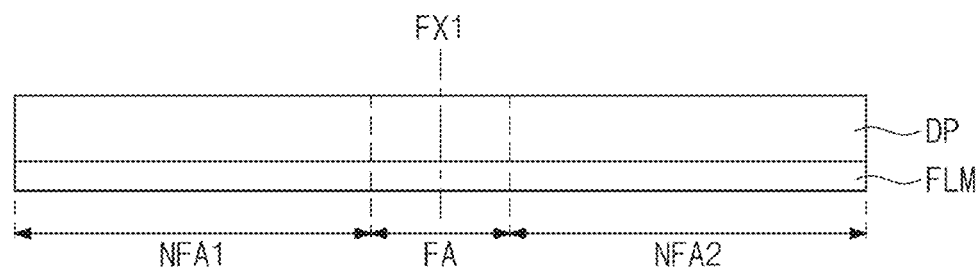
FIGS. 8A to 8E are cross-sectional views illustrating an exemplary embodiment of a process of manufacturing a display device according to the invention.
Figure 8A:
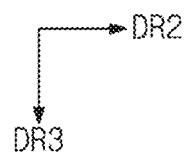

Referring to FIG. 8A, a folding area FA folded with respect to a virtual first folding axis FX1 and first and second non-folding areas NFA1 and NFA2, which are adjacent to both sides of the folding area FA, are defined, and a display panel displaying an image is prepared. A protection film FLM may be disposed on a second surface (top surface) of the display panel DP. The protection film FLM may prevent the top surface of the display panel DP from being damaged during the manufacturing and may facilitate handling during the manufacturing. Since the protection film FLM is removed during the manufacturing, adhesion force between the protection film FLM and the display panel DP may not be strong. Although not shown, the protection film FLM may include an adhesion layer and a protection film base.

Figure 8B:
Figure 8B:
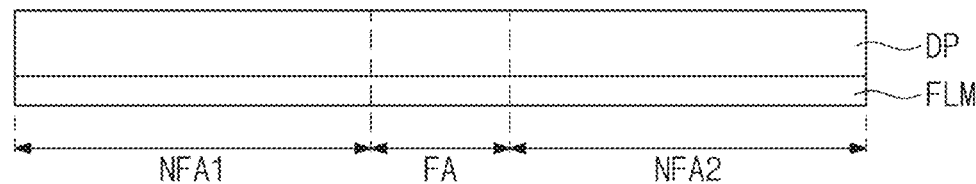
Figure 8B:
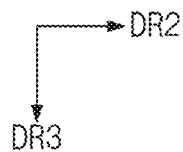

Referring to FIG. 8B, an inkjet printing unit INK is disposed above the display panel DP. The inkjet printing unit INK may provide a resin on a first surface (bottom surface) of the display panel DP. In an exemplary embodiment, the inkjet printing unit INK may simultaneously provide the resin RS to an entire surface of the first surface (bottom surface) of the display panel DP or may provide the resin RS on the entire surface of the first surface (bottom surface) while moving in a predetermined direction.

Figure 8C:
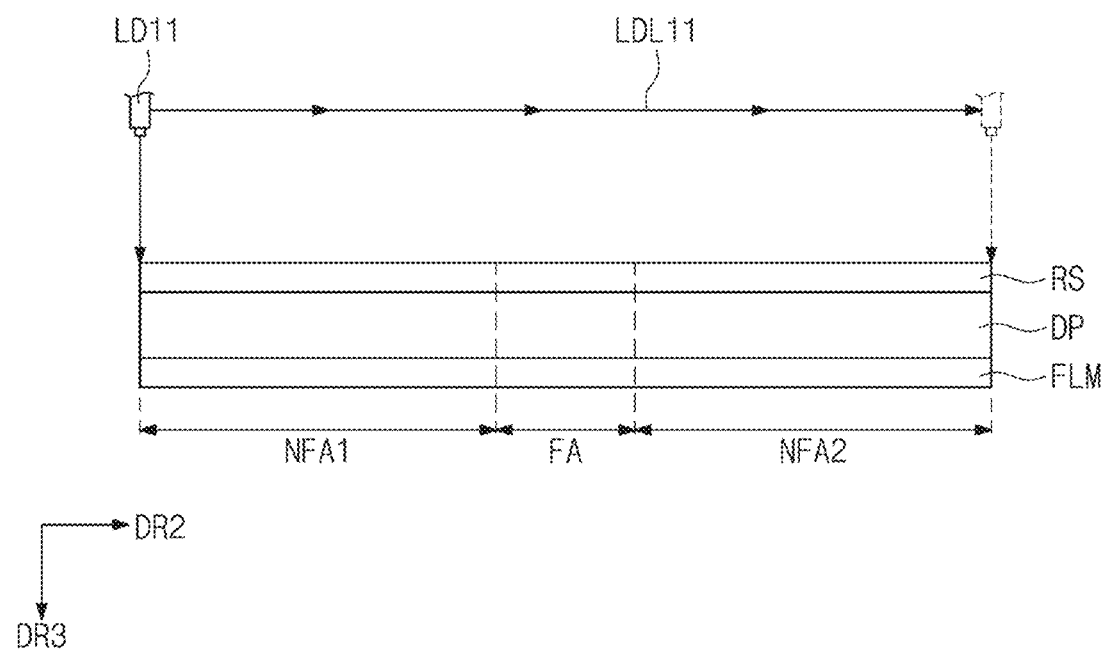

Referring to FIG. 8C, the resin RS may be uniformly applied on the entire surface of the first surface of the display panel DP by the inkjet printing unit INK illustrated in FIG. 8B. The resin RS may be applied by the inkjet printing unit INK and may include a material (e.g., silicone, an acrylic compound, etc.) that is hardened by heat or light.

A first light generation device LD11 is disposed above the resin RS. A first light generation device LD11 may be a device that generates ultraviolet ("UV") light. The hardening of the resin RS may vary depending on a temperature, a UV light irradiation time, a wavelength, roughness, energy, and the like. In another exemplary embodiment, a degree of hardening (modulus) of the resin RS may also vary according to an ambient atmosphere (e.g., a sealed state or an atmospheric state) to which UV light is irradiated.

In an exemplary embodiment, the first light generation device LD11 may generate the UV light while moving along a first movement path LDL11 in a predetermined direction (for example, the second direction DR2) to primarily harden the resin RS. In another exemplary embodiment, when the UV light generated by the first light generation device LD11 may cover the entire surface of the resin RS at the same time on the display panel DP, the first light generation device LD11 may harden the entire surface of the resin RS at the same time without movement of the first light generation device LD11.

Figure 8D:
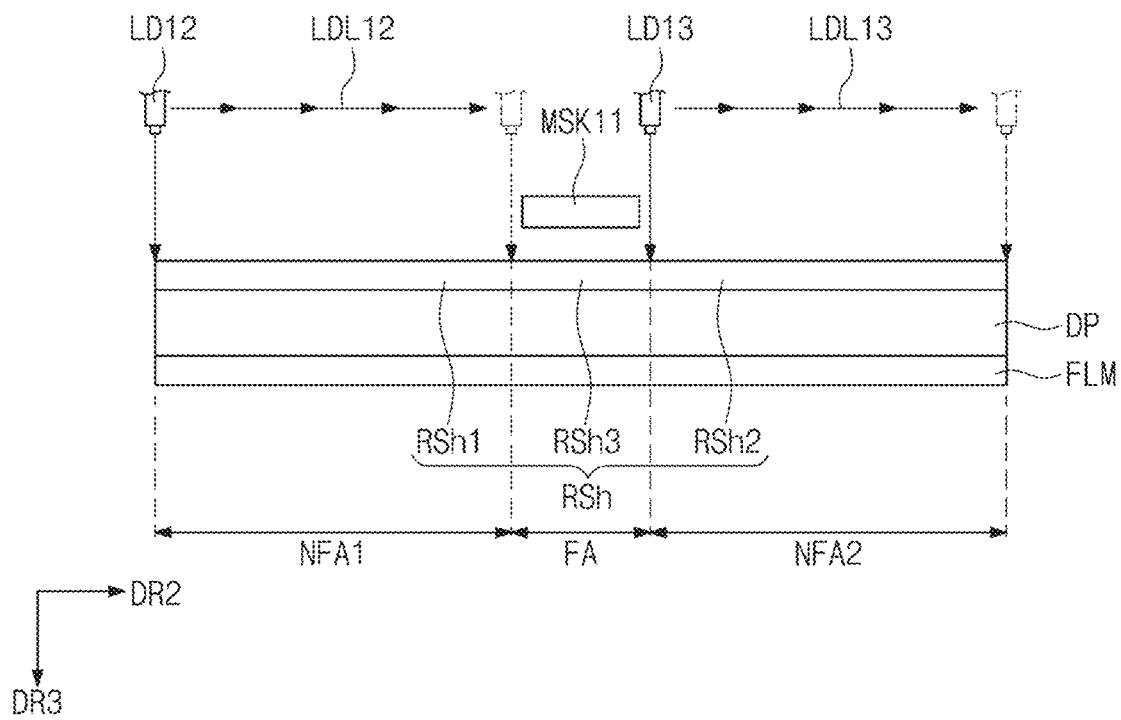

Referring to FIG. 8D, a primarily hardened resin RSh hardened by the first light generation device LD11 illustrated in FIG. 8C may include a first resin area RSh1 corresponding to the first non-folding area NFA1 of the display panel DP, a second resin area RSh2 corresponding to the second non-folding area NFA2 of the display panel DP, and a third resin area RSh3 corresponding to the folding area FA of the display panel DP.

A mask MSK11 is disposed above the second resin area RSh2. The mask MSK11 may include a material that does not transmit the UV light.

A second light generation device LD12 is disposed above the first resin area RSh1 of the primarily hardened resin RSh. The second light generation device LD12 may be a device that generates the UV light.

In an exemplary embodiment, the second light generation device LD12 may secondarily harden the first resin area RSh1 of the primarily hardened resin RSh by generating the UV light while moving along the second movement path LDL12.

The third light generation device LD13 is disposed above the second resin area RSh2 of the primarily hardened resin RSh. The third light generation device LD13 may be a device that generates the UV light.

In an exemplary embodiment, the third light generation device LD13 may secondarily harden the second resin area RSh2 of the hardened resin RSh by generating the UV light while moving along the third movement path LDL13.

In an exemplary embodiment, the UV light generated by the second light generation device LD12 and the UV light generated by the third light generation device LD13 may have the same illuminance, waveform, and energy. In another exemplary embodiment, the first resin area RSh1 and the second resin area RSh2 of the primarily hardened resin RSh may be secondarily hardened sequentially or simultaneously by generating the UV light while the second light generation device LD12 moves along the second movement path LDL12 and the third movement path LDL13.

In another exemplary embodiment, when the UV light generated in the second light generation device LD12 covers the first resin area RSh1 and the second resin area RSh2 of the primarily hardened resin RSh on the display panel DP at the same time, the second light generation device LD12 may harden the first resin area RSh1 and the second resin area RSh2 at the same time without moving, and thus, the third light generation device LD13 may not be necessary.

The UV light generated in the first light generation device LD11 of FIG. 8C may be identical to or different from the UV light generated in the second light generation device LD12 and the UV light generated in the third light generation device LD13, which are illustrated in FIG. 8D.

Figure 8E:
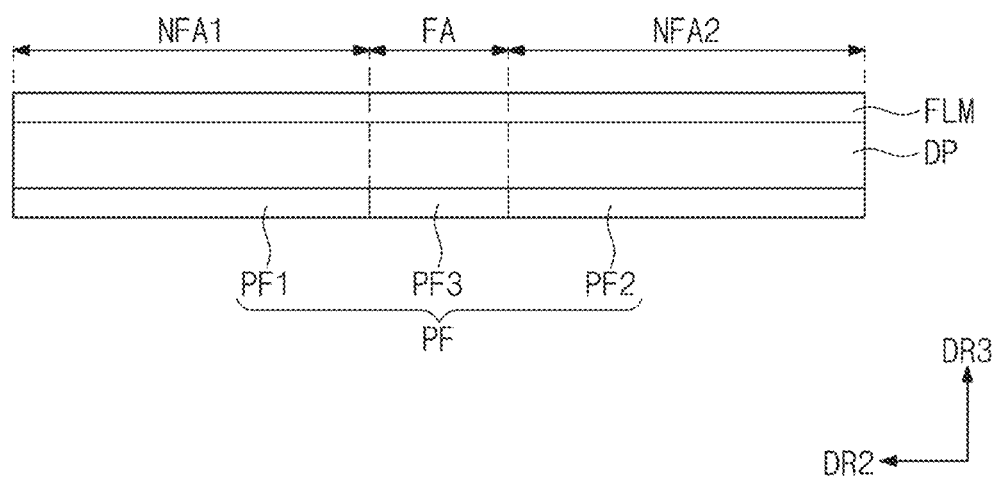

Referring to FIG. 8E, a protection layer PF may be disposed on a first surface of the display panel DP through the first hardening process of FIG. 8 and the second hardening process of FIG. 8D. The protection layer PF includes a first protection layer area PF1 corresponding to the first non-folding area NFA1, a second protection layer area PF2 corresponding to the second non-folding area NFA2, and a third protection layer area PF3 corresponding to the folding area FA on the display panel DP.

As illustrated in FIG. 8C, the entire surface of the resin RS applied to the first surface of the display panel DP may be primarily hardened by the UV light generated in the first light generation device LD11.

As illustrated in FIG. 8D, the first resin area RSh1 and the second resin area RSh2 of the primarily hardened resin RSh may be secondarily hardened by the second light generation device LD12 and the third light generation device LD13, respectively. The third resin area RSh3 covered by the mask MSK11 is not secondarily hardened.

As energy (unit: J) of the UV light increases, the number of times of exposure to the UV light increases, and a modulus of hardening of the resin RS increases. The first protection layer area PF1 and the second protection layer area PF2 of the protection layer PF, on which the primary hardening and the secondary hardening are performed, have a high modulus, and the third protection layer area PF3 on which only the primary hardening is performed has a low modulus.

Table 1 shows an example of the modulus of the resin in terms of megapascal (Mpa) according to the energy of the UV light in terms of joule (J).

TABLE 1

| UV light energy [J] | Modulus [MPa] |
| --- | --- |
| 2 | 509.2 ± 3.4 |
| 3 | 483 ± 8.3 |
| 12 | 2475.1 ± 30.8 |
| 24 | 2748.9 ± 60.0 |

In the exemplary embodiment of Table 1, it is assumed that other conditions such as an intensity, a wavelength, a temperature, an UV light irradiation time, etc., of the UV light are the same. As shown in the example of Table 1, the more the energy of the UV light increases, the more the modulus of the resin RS increases. Table 1 exemplarily shows a variation in modulus according to the energy of the UV light, but the invention is not limited thereto.

In an exemplary embodiment, the UV light generated in the first light generation device LD11 of FIG. 8C may have energy of about 2 J, and each of the UV light generated in the second light generation device LD12 and the UV light generated in the third light generation device LD13, which are illustrated in FIG. 8D, may have energy of about 12 J, for example. In this case, the third protection layer area PF3 formed after only the primary hardening is performed may have a low modulus (e.g., about 483 Mpa), and each of the first protection layer area PF1 and the second protection layer area PF2 of the protection layer PF, on which the primary hardening and the secondary hardening are performed, may have a high modulus (e.g., 2,475 Mpa or more).

The third protection layer area PF3 corresponding to the folding area FA of the display panel DP may have a low modulus to improve flexibility. Also, each of the first protection layer area PF1 and the second protection layer area PF2, which correspond to the first non-folding area NFA1 and the second non-folding area NFA2 of the display panel DP, may have a high modulus to improve durability of the display panel DP. Thus, the display device DD of FIG. 1 may be improved in reliability. Also, the protection layer PF may be disposed on the first surface of the display panel DP without a separate adhesion layer or adhesion material.

FIGS. 9A to 9E are plan views illustrating an exemplary embodiment of a process of manufacturing the display device according to the invention.

Referring to FIG. 8A, a folding area FA folded with respect to a virtual first folding axis FX1 and first and second non-folding areas NFA1 and NFA2, which are adjacent to both sides of the folding area FA, are defined, and a display panel displaying an image is prepared. A protection film FLM may be disposed on a second surface (top surface) of the display panel DP.

Figure 9A:
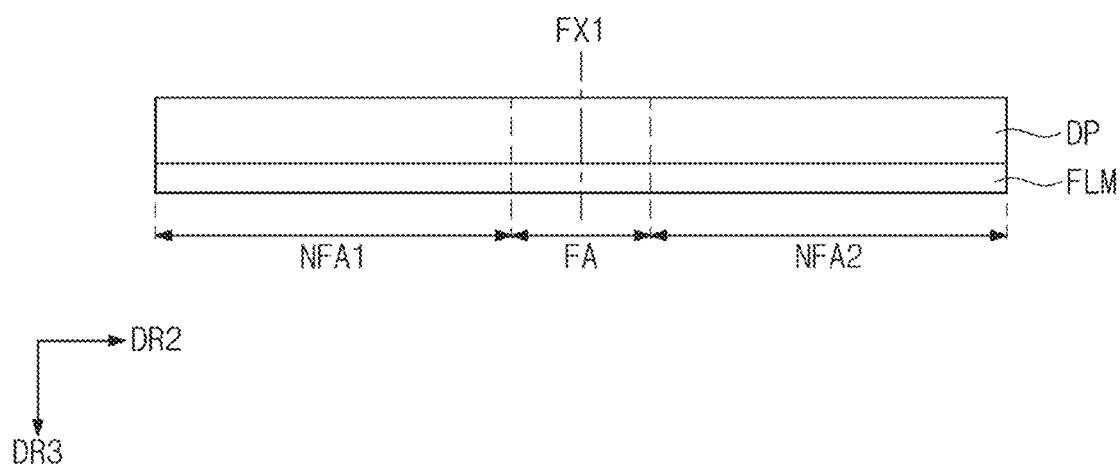
FIGS. 9A to 9E are plan views illustrating an exemplary embodiment of a process of manufacturing a display device according to the invention.
Figure 9B:
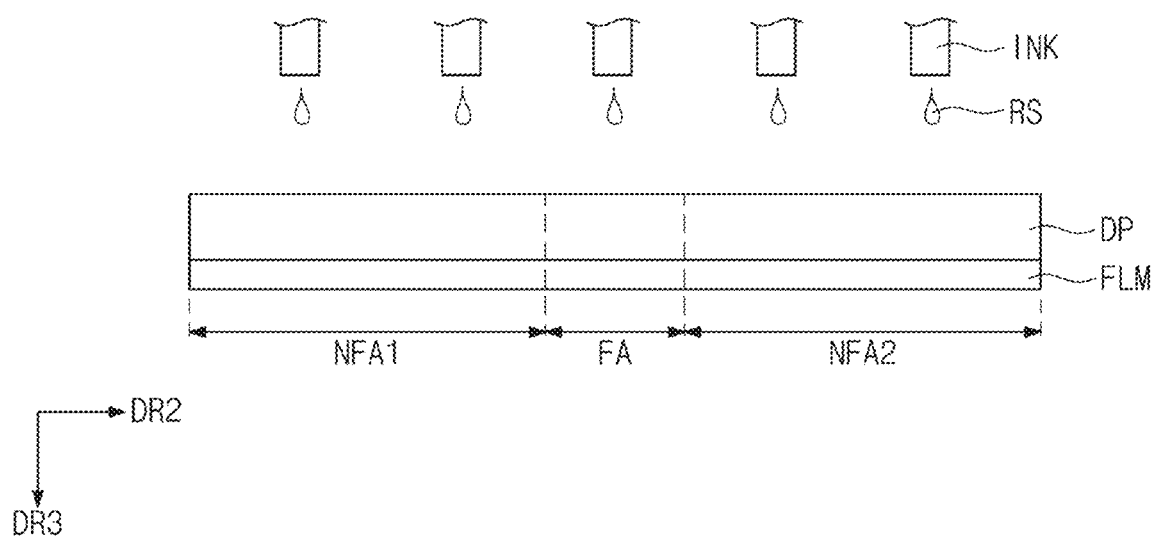

Referring to FIG. 9B, an inkjet printing unit INK is disposed above the display panel DP. The inkjet printing unit INK may provide a resin RS on a first surface (bottom surface) of the display panel DP. In an exemplary embodiment, the inkjet printing unit INK may simultaneously provide the resin RS to an entire surface of the first surface (bottom surface) of the display panel DP or may provide the resin RS on the entire surface of the first surface (bottom surface) while moving in a predetermined direction.

Figure 9C:
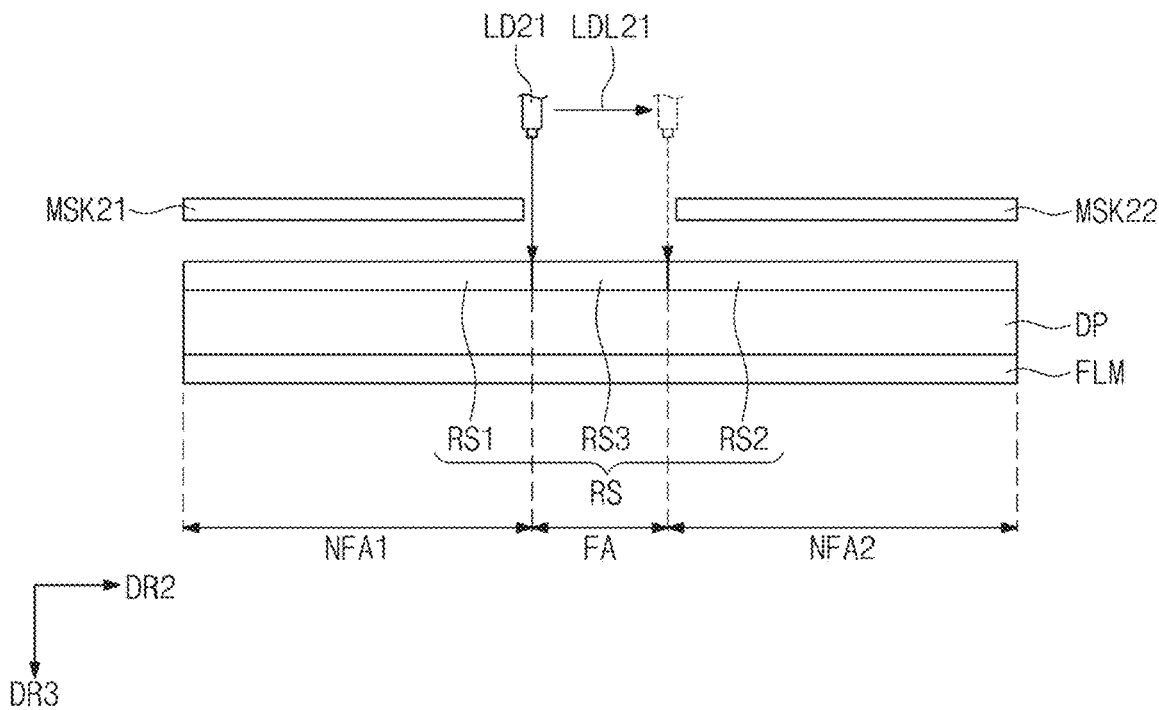

Referring to FIG. 9C, the resin RS may be uniformly applied on the entire surface of the first surface of the display panel DP by the inkjet printing unit INK illustrated in FIG. 9B. The resin RS may be applied by the inkjet printing unit INK and may include a material (e.g., silicone, an acrylic compound, etc.) that is hardened by heat or light. The resin RS includes a first area RS1 corresponding to the first non-folding area NFA1, a second area RS2 corresponding to the second non-folding area NFA2, and a third area RS3 corresponding to the folding area FA on the display panel DP.

A first mask MSK21 is disposed above the first area RS1. A second mask MSK22 is disposed above the second area RS2. Each of the first mask MSK21 and the second mask MSK22 may include a material that does not transmit UV light.

A first light generation device LD21 is disposed above the third area RS3 of the resin RS. The first light generation device LD21 may be a device that generates the UV light. The hardening of the resin RS may vary depending on a temperature, a UV light irradiation time, a wavelength, roughness, energy, and the like.

In an exemplary embodiment, the first light generation device LD21 may generate the UV light while moving along a first movement path LDL21 in a predetermined direction (for example, the second direction DR2) to primarily harden the third area RS3 of the resin RS. In another exemplary embodiment, when the UV light generated by the first light generation device LD21 may cover the entire surface of the third area RS3 at the same time, the first light generation device LD21 may harden the entire surface of the third area RS3 at the same time without movement of the first light generation device LD21.

Figure 9D:
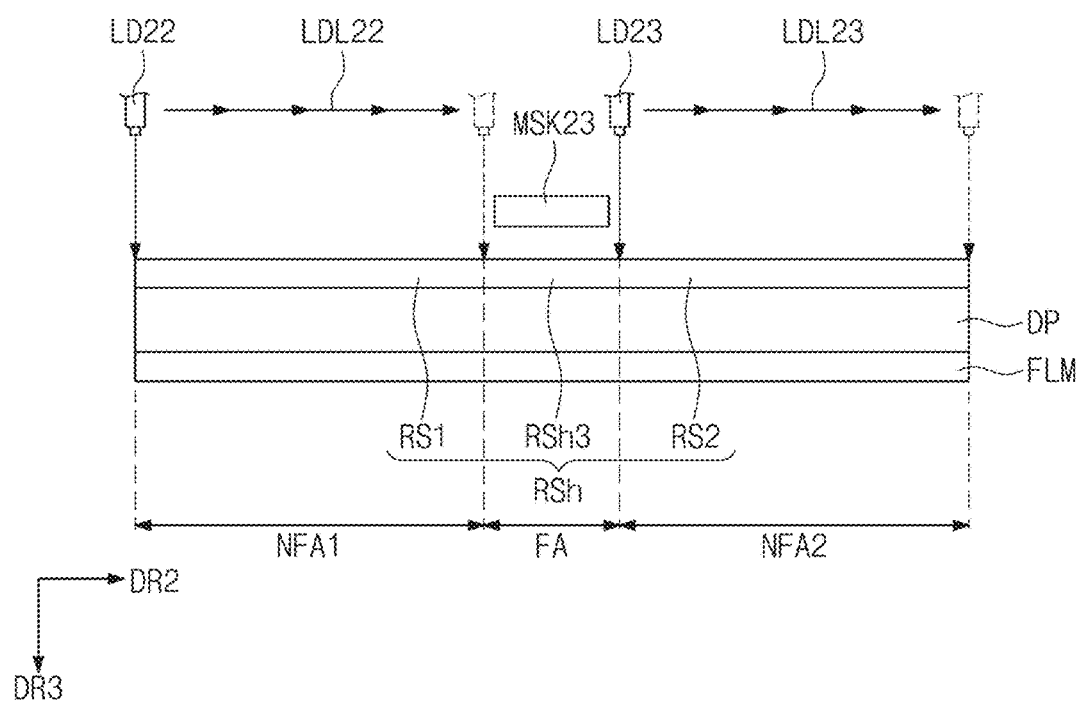

Referring to FIG. 9D, a primarily hardened resin RSh partially hardened by the first light generation device LD21 illustrated in FIG. 9C may include a first area RS1 corresponding to the first non-folding area NFA1 of the display panel DP, a second area RS2 corresponding to the second non-folding area NFA2 of the display panel DP, and a third resin area RSh3 corresponding to the folding area FA of the display panel DP. The third resin area RSh3 is an area that is primarily hardened by the first light generation device LD21 of FIG. 9C.

The third mask MSK23 is disposed above the second area RS2.

The second light generation device LD22 is disposed above the first area RS1 of the partially hardened resin RSh. The second light generation device LD22 may be a device that generates the UV light.

In an exemplary embodiment, the second light generation device LD22 may harden the first area RS1 of the primarily hardened resin RSh by generating the UV light while moving along the second movement path LDL22.

The third light generation device LD23 is disposed above the second area RS2 of the partially hardened resin RSh. The third light generation device LD23 may be a device that generates the UV light.

In an exemplary embodiment, the third light generation device LD23 may harden the second area RS2 of the partially hardened resin RSh by generating the UV light while moving along the third movement path LDL23.

In an exemplary embodiment, the UV light generated by the second light generation device LD22 and the UV light generated by the third light generation device LD23 may have the same illuminance, waveform, and energy. In another exemplary embodiment, the first area RS1 and the second area RS2 of the primarily hardened resin RSh by generating the UV light while the second light generation device LD22 moves along the second movement path LDL22 and the third movement path LDL23 may be hardened sequentially or simultaneously.

In another exemplary embodiment, when the UV light generated in the second light generation device LD22 covers the first area RS1 and the second area RS2 of the primarily hardened resin RSh on the display panel DP at the same time, the second light generation device LD22 may harden the first area RS1 and the second area RS2 at the same time without moving, and thus, the third light generation device LD23 may not be necessary.

The UV light generated by the first light generator LD21 of FIG. 9C and the UV light generated by the second light generator LD22 of FIG. 9D may be different from the UV generated by the third light generator LD23 of FIG. 9D. That is, the UV light that hardens the third area RS3 of FIG. 9C and the UV light that hardens the first area RS1 and the second area RS2 may be different from each other in at least one of a light irradiation time, a wavelength, illuminance, or energy. In an exemplary embodiment, the UV light that hardens the third area RS3 and the UV light that hardens the first area RS1 and the second area RS2 may have different energy.

Figure 9E:
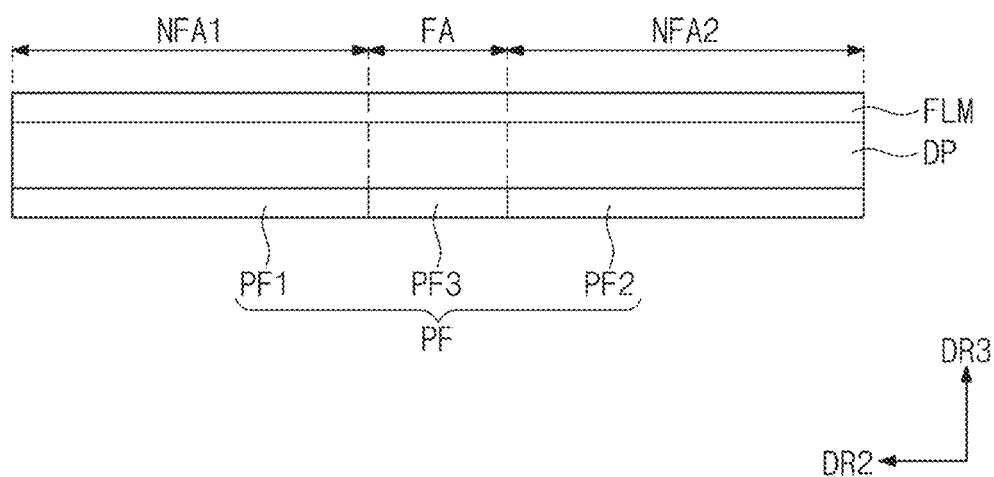

Referring to FIG. 9E, a protection layer PF may be disposed on a first surface (bottom surface) of the display panel DP through the first hardening process of FIG. 9C and the second hardening process of FIG. 9D. The protection layer PF includes a first protection layer area PF1 corresponding to the first non-folding area NFA1, a second protection layer area PF2 corresponding to the second non-folding area NFA2, and a third protection layer area PF3 corresponding to the folding area FA on the display panel DP.

As illustrated in FIG. 9C, the third area RS3 of the resin RS applied to the first surface of the display panel DP may be primarily hardened by the UV light generated in the first light generation device LD21. The first area RS1 and the second area RS2 covered by the first mask MSK21 and the second mask MSK22 are not primarily hardened.

As illustrated in FIG. 9D, the first area RS1 and the second area RS2 of the primarily hardened resin RSh may be secondarily hardened by the second light generation device LD22 and the third light generation device LD23, respectively. The third area RS3 covered by the third mask MSK23 is not secondary hardened.

As energy (unit: J) of the UV light increases, a modulus of hardening of the resin RS increases. When the energy of the UV light used in the first area RS1 and the second area RS2 of the primarily hardened resin RSh is greater than that of the UV light used in the primary hardening of the third area RS3 of the resin RS, each of the first protection layer area PF1 and the second protection layer area PF2 of the protection layer PF has a high modulus, and the third protection layer area PF3 on which only the first hardening is performed has a low modulus.

Therefore, the third protection layer area PF3 corresponding to the folding area FA of the display panel DP may have a low modulus to improve flexibility. Also, each of the first protection layer area PF1 and the second protection layer area PF2, which correspond to the first non-folding area NFA1 and the second non-folding area NFA2 of the display panel DP, may have a high modulus to improve durability of the display panel DP. Thus, the display device DD of FIG. 1 may be improved in reliability. Also, the protection layer PF may be disposed on the first surface of the display panel DP without a separate adhesion layer or adhesion material.

FIGS. 10A to 10F are plan views illustrating an exemplary embodiment of a process of manufacturing a display device according to the invention.

Figure 10A:
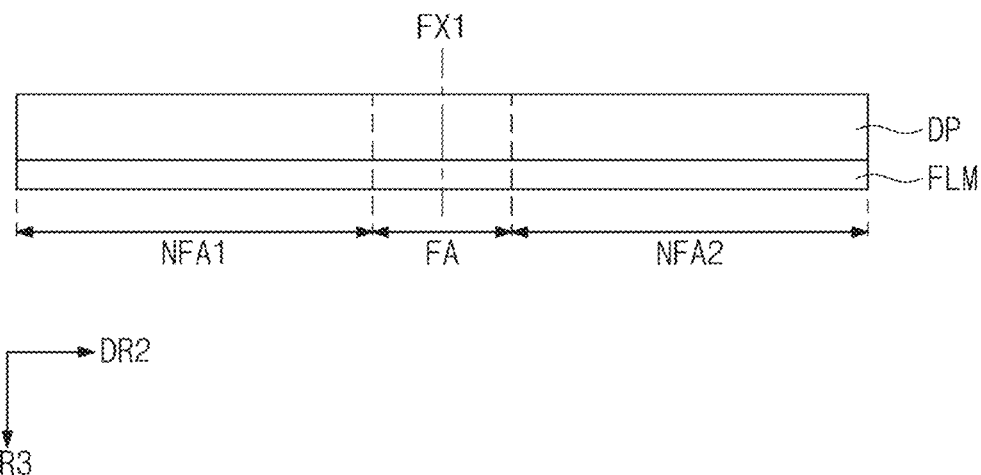
FIGS. 10A to 10F are plan views illustrating an exemplary embodiment of a process of manufacturing a display device according to the invention.

Referring to FIG. 10A, a folding area FA folded with respect to a virtual folding axis FX2 and first and second non-folding areas NFA1 and NFA2, which are adjacent to both sides of the folding area FA, are defined, and a display panel displaying an image is prepared. A protection film FLM may be disposed on a second surface (top surface) of the display panel DP.

Figure 10B:
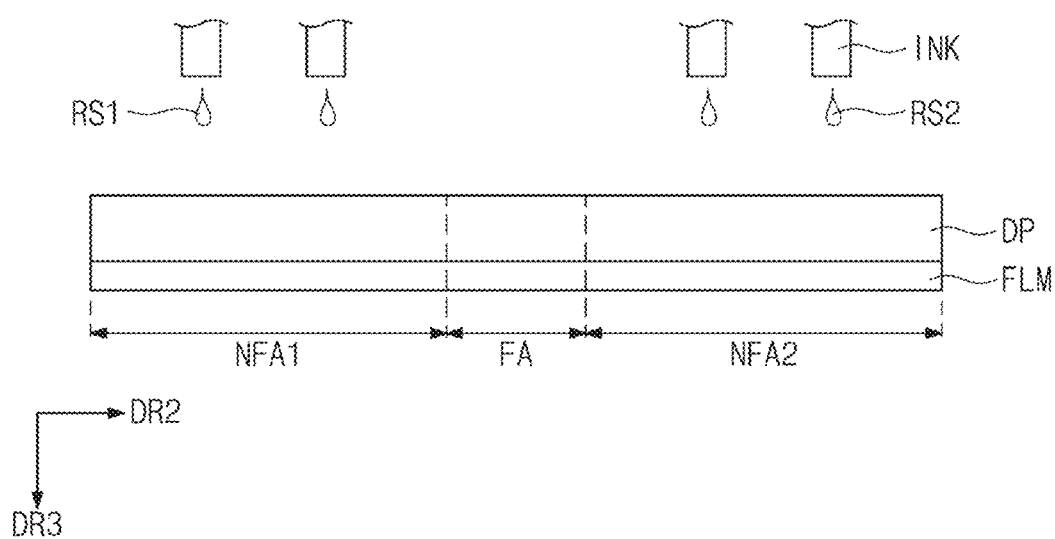

Referring to FIG. 10B, an inkjet printing unit INK is disposed above the display panel DP. The inkjet printing unit INK may provide a resin on a first surface (bottom surface) of the display panel DP. The inkjet printing unit INK provides a first resin RS1 on the first non-folding area NFA1 of the first surface of the display panel DP and provides a second resin RS2 on the second non-folding area NFA2 of the first surface of the display panel DP.

In an exemplary embodiment, the first resin RS1 and the second resin RS2 are the same material, but the invention is not limited thereto. In another exemplary embodiment, the first resin RS1 and the second resin RS2 may be materials having moduli different from each other.

Figure 10C:
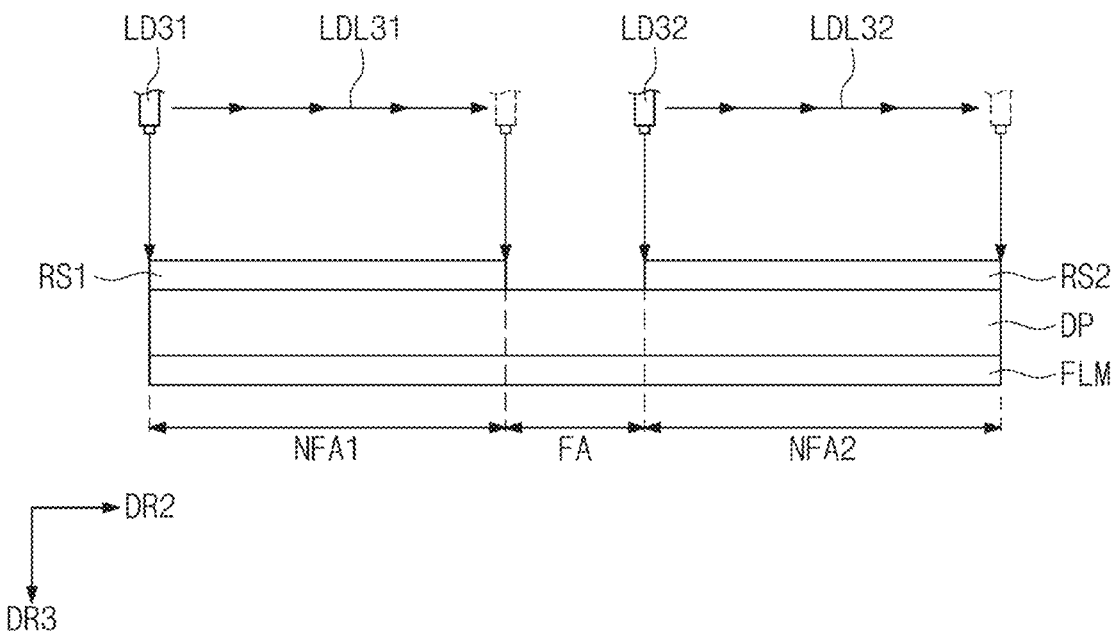

Referring to FIG. 10C, the first resin RS1 is applied to the first non-folding area NFA1 of the first surface of the display panel DP by the inkjet printing unit INK of FIG. 10B, and the second resin RS2 may be uniformly applied to the second non-folding area NFA2. Each of the first resin RS1 and the second resin RS2 may be applied by the inkjet printing unit INK and may include a material (e.g., silicone, an acrylic compound, etc.) that is hardened by heat or light.

The first light generation device LD31 is disposed above the first resin RS1. The first light generation device LD31 may be a device that generates UV light. The hardening of the first resin RS1 may vary depending on a temperature, a UV light irradiation time, a wavelength, roughness, energy, and the like.

In an exemplary embodiment, the first light generation device LD31 may generate the UV light while moving along a first movement path LDL31 in a predetermined direction (for example, the second direction DR2) to primarily harden the first resin RS1. In another exemplary embodiment, when the UV light generated by the first light generation device LD31 may cover an entire surface of the first resin RS1 at the same time, the first light generation device LD31 may harden the entire surface of the first resin RS1 at the same time without movement of the first light generation device LD31.

The second light generation device LD32 is disposed above the second resin RS2. The second light generation device LD32 may be a device that generates the UV light. The hardening of the second resin RS2 may vary depending on a temperature, a UV light irradiation time, a wavelength, roughness, energy, and the like.

In an exemplary embodiment, the second light generation device LD32 may generate the UV light while moving along a second movement path LDL32 in a predetermined direction (for example, the second direction DR2) to primarily harden the second resin RS2. In another exemplary embodiment, when the UV light generated by the second light generation device LD32 may cover the entire surface of the second resin RS2 at the same time, the second light generation device LD32 may harden the entire surface of the second resin RS2 at the same time without movement of the second light generation device LD32.

In another exemplary embodiment, when the UV light generated in the first light generation device LD31 covers the first resin RS1 and the second resin RS2 at the same time, the first light generation device LD31 may harden the first resin RS1 and the second resin RS2 at the same time without moving, and thus, the second light generation device LD32 may not be necessary.

Figure 10D:
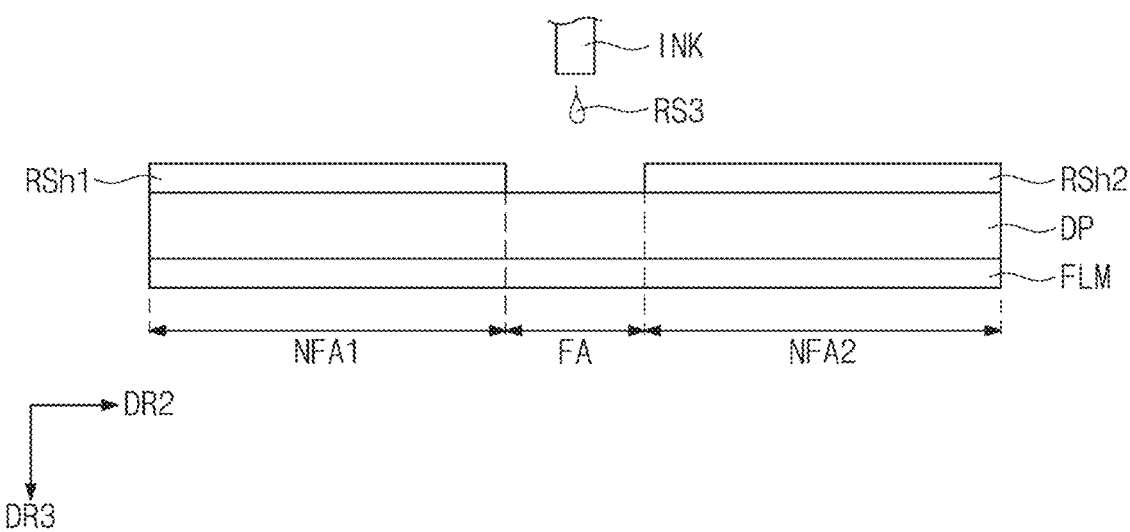

Referring to FIG. 10D, an inkjet printing unit INK is disposed above the display panel DP. The inkjet printing unit INK may provide a third resin RS3 to the folding area FA of the first surface (bottom surface) of the display panel DP. The third resin RS3 may include a material having a modulus different from that of each of the first resin RS1 and the second resin RS2. In an exemplary embodiment, the first resin RS1 and the second resin RS2, which respectively correspond to the first non-folding area NFA1 and the second non-folding area NFA2 of the display panel DP, may include materials having moduli different from each other, for example. Also, each of the first resin RS1 and the second resin RS2 may include a material having a modulus greater than that of the third resin RS3 corresponding to the folding area FA of the display panel DP.

In another exemplary embodiment, the inkjet printing unit INK may provide a resin on the folding area FA of the first surface of the display panel DP while moving in a predetermined direction.

Figure 10E:
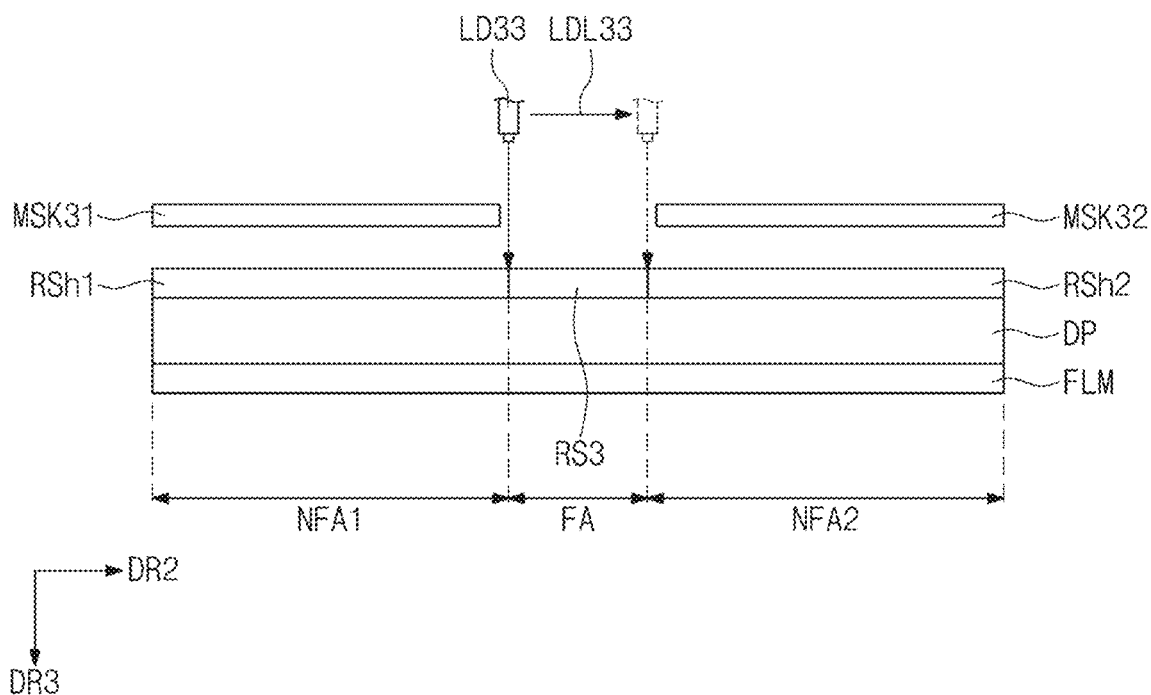

Referring to FIG. 10E, the first mask MSK31 is disposed above the hardened first resin area RSh1. The second mask MSK32 is disposed above the hardened second resin area RSh2. Each of the first mask MSK31 and the second mask MSK32 may include a material that does not transmit the UV light.

A third light generation device LD33 is disposed above the third resin RS3. The third light generation device LD33 may be a device that generates the UV light. The hardening of the third resin RS3 may vary depending on a temperature, a UV light irradiation time, a wavelength, roughness, energy, and the like.

In an exemplary embodiment, the third light generation device LD33 may generate the UV light while moving along a third movement path LDL33 in a predetermined direction (for example, the second direction DR2) to harden the third resin RS3. In another exemplary embodiment, when the UV light generated by the third light generation device LD33 may cover an entire surface of the third resin RS3 at the same time on the display panel DP, the third light generation device LD33 may harden the entire surface of the third resin RS3 at the same time without movement of the third light generation device LD33.

The UV light generated in the first light generation device LD31 of FIG. 10C and the UV light generated in the second light generation device LD32 of FIG. 10C are identical to or different from the UV light generated in the third light generation device LD33 of FIG. 10E.

Figure 10F:
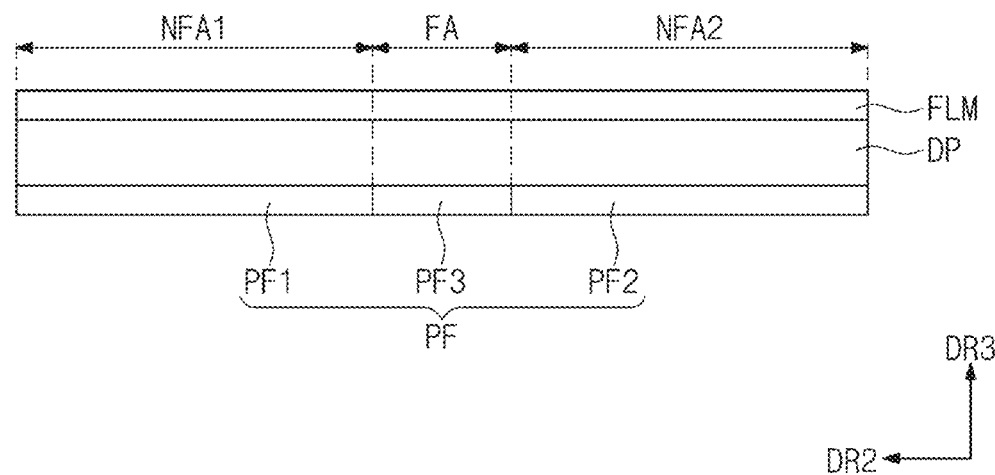

Referring to FIG. 10F, the protection layer PF includes a first protection layer area PF1 corresponding to the first non-folding area NFA1, a second protection layer area PF2 corresponding to the second non-folding area NFA2, and a third protection layer area PF3 corresponding to the folding area FA on the display panel DP.

As described above, the first resin RS1 (refer to FIG. 10C) and the second resin RS2 (refer to FIG. 10C), which respectively correspond to the first non-folding area NFA1 and the second non-folding area NFA2 of the display panel DP, may include materials having the same modulus, and each of the first resin RS1 and the second resin RS2 may include a material having a modulus greater than that of the third resin RS3 (refer to FIG. 10E) corresponding to the folding area FA of the display panel DP.

Also, each of the first protection layer area PF1 and the second protection layer area PF2, which are formed after hardening the first resin RS1 and the second resin RS2 of FIG. 10C may have a modulus greater than that of the third protection layer area PF3 after hardening the third resin RS3 of FIG. 10E. In another exemplary embodiment, although the first resin RS1, the second resin RS2, and the third resin RS3 include materials having the same modulus, each of the first protection layer area PF1 and the second protection layer area PF2 may have a higher modulus than that of the third protection layer area PF3 through the hardening process of FIG. 10C and the hardening process of FIG. 10E.

Therefore, the third protection layer area PF3 corresponding to the folding area FA of the display panel DP may have a low modulus to improve flexibility. Also, each of the first protection layer area PF1 and the second protection layer area PF2, which correspond to the first non-folding area NFA1 and the second non-folding area NFA2 of the display panel DP, may have a high modulus to improve durability of the display panel DP. Thus, the display device DD of FIG. 1 may be improved in reliability. Also, the protection layer PF may be disposed on the first surface of the display panel DP without a separate adhesion layer or adhesion material.

According to the exemplary embodiments of the invention, the protection layer disposed on the lower portion of the folding area of the display panel may be improved in flexibility, and the non-folding area may increase in modulus. Therefore, the display device having the improved durability and reliability may be provided.

It will be apparent to those skilled in the art that various modifications and variations may be made in the invention. Thus, it is intended that the invention covers the modifications and variations of this invention provided they come within the scope of the appended claims and their equivalents.

Hence, the real protective scope of the invention shall be determined by the technical scope of the accompanying claims.

What is claimed is:

1. A method for manufacturing a display device, the method comprising:
preparing a display panel which defines a folding area folded with reference to a virtual folding axis, a first non-folding area and a second non-folding area adjacent to both sides of the folding area, and which displays an image;
providing a resin on a first surface of the display panel;
primarily hardening the resin; and
secondarily hardening a first resin area of the resin, which corresponds to the first non-folding area of the display panel, and a second resin area of the resin, which corresponds to the second non-folding area of the display panel,
wherein the primarily hardening the resin comprises a first light irradiation process,
wherein the secondarily hardening the first resin area and the second resin area comprises a second light irradiation process and a third light irradiation process,
wherein the second light irradiation process is performed on a top surface of the first resin area along a first movement path, and
the third light irradiation process is performed on a top surface of the second resin area along a second movement path.

2. The method of claim 1, wherein the providing the resin on the first surface of the display panel is performed by an inkjet printing unit.

3. The method of claim 1, wherein the first light irradiation process is performed by ultraviolet light.

4. The method of claim 1, wherein the first light irradiation process is performed on a top surface of the resin along a first third movement path.

5. The method of claim 1, wherein each of the second light irradiation process and the third light irradiation process is performed by ultraviolet light.

6. The method of claim 1, wherein each of energy of second light used in the second light irradiation process and energy of third light used in the third light irradiation process is greater than energy of first light used in the first light irradiation process.

7. The method of claim 6, wherein the energy of the second light used in the second light irradiation process and the energy of the third light used in the third light irradiation process are the same as each other.

8. The method of claim 1, wherein the secondarily hardening the first resin area and the second resin area comprises:
preparing a mask above a third resin area corresponding to the folding area of the display panel; and
secondarily hardening the first resin area and the second resin area.

9. The method of claim 1, wherein, after the primarily hardening the resin, a third protection layer area corresponding to the folding area of the display panel is formed, after the secondarily hardening the first resin area, a first protection layer area is formed, after the secondarily hardening the second resin area, a second protection layer area is formed, and each of the first protection layer area and the second protection layer area has a modulus greater than a modulus of the third protection layer area.

10. The method of claim 1, wherein the primarily hardening the resin comprises:

preparing a mask above each of the first resin area and the second resin area; and primarily hardening a third resin area of the resin corresponding to the folding area of the display panel.

11. The method of claim 10, wherein the primarily hardening the third resin area comprises a first light irradiation process, the secondary hardening of the first resin area and the second resin area comprise a second light irradiation process and a third light irradiation process, and each of the first light irradiation process, the second light irradiation process, and the third light irradiation process is performed by ultraviolet light.

12. The method of claim 11, wherein each of energy of second light used in the second light irradiation process and energy of third light used in the third light irradiation process is greater than energy of first light used in the first light irradiation process.

13. A method for manufacturing a display device, the method comprising:

preparing a display panel which defines a folding area folded with reference to a virtual folding axis, a first non-folding area and a second non-folding area, which are adjacent to both sides of the folding area, and which displays an image;

providing a first resin on a first resin area corresponding to the first non-folding area of a first surface of the display panel and providing a second resin on a second resin area corresponding to the second non-folding area of the first surface of the display panel;

primarily hardening the first resin and the second resin;

providing a third resin on a third resin area corresponding to the folding area of the first surface of the display panel; and secondarily hardening the third resin, wherein each of the first resin and the second resin comprises a material having a modulus different from a modulus of the third resin.

14. The method of claim 13, wherein the primarily hardening the first resin and the second resin comprises a first light irradiation process, the hardening the third resin comprises a second light irradiation process, and each of the first light irradiation process and the second light irradiation process is performed by ultraviolet light.

* * * * *